(12) United States Patent
Kreager

(10) Patent No.: US 7,339,368 B2
(45) Date of Patent: Mar. 4, 2008

(54) METHODS AND APPARATUS FOR TESTING CIRCUIT BOARDS

(75) Inventor: Douglas P. Kreager, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 227 days.

(21) Appl. No.: 10/895,600

(22) Filed: Jul. 21, 2004

(65) Prior Publication Data

US 2006/0028226 A1 Feb. 9, 2006

(51) Int. Cl.
*G01R 31/28* (2006.01)

(52) U.S. Cl. .................... 324/158.1; 324/760

(58) Field of Classification Search ............. None
See application file for complete search history.

(56) References Cited

U.S. PATENT DOCUMENTS

| | | | |
|---|---|---|---|
| 3,970,934 A * | 7/1976 | Aksu | 324/754 |
| 4,771,234 A * | 9/1988 | Cook et al. | 324/754 |
| 5,543,717 A * | 8/1996 | Kordas | 324/444 |
| 5,543,727 A * | 8/1996 | Bushard et al. | 324/760 |
| 5,604,445 A * | 2/1997 | Desai et al. | 324/755 |
| 5,923,176 A * | 7/1999 | Porter et al. | 324/754 |
| 6,040,691 A * | 3/2000 | Hanners et al. | 324/158.1 |
| 6,064,217 A * | 5/2000 | Smith | 324/760 |
| 6,091,253 A * | 7/2000 | Huang | 324/758 |
| 6,326,797 B2 * | 12/2001 | Caggiano et al. | 324/719 |
| 6,624,653 B1 * | 9/2003 | Cram | 324/765 |
| 6,894,479 B2 * | 5/2005 | Siefers et al. | 324/158.1 |
| 7,084,650 B2 * | 8/2006 | Cooper et al. | 324/754 |
| 2004/0113640 A1 * | 6/2004 | Cooper et al. | 324/754 |

* cited by examiner

*Primary Examiner*—Ha Tran Nguyen
*Assistant Examiner*—Richard Isla-Rodas
(74) *Attorney, Agent, or Firm*—Buckley, Maschoff & Talwalkar LLC

(57) ABSTRACT

A method includes placing a circuit board on a test sheet so that conductive pins on an underside of the circuit board are in electrically conductive contact with electrically conductive contact pads on an upper surface of the test sheet. The test sheet includes connectors at a periphery of the test sheet. The connectors couple the test sheet to test signal generating devices. The method further includes applying test signals to the circuit board via the test sheet. Other embodiments are described and claimed.

21 Claims, 6 Drawing Sheets

METHODS AND APPARATUS FOR TESTING CIRCUIT BOARDS

BACKGROUND

Testing of circuit boards may be labor-intensive, with test operators sometimes required to plug numerous test/peripheral devices into a board-under-test (BUT) prior to beginning a test procedure, and then unplugging the numerous test/peripheral devices after the procedure is complete. In some cases, the amount of hand labor required to perform tests has been reduced, and test throughput has been increased, by supplying automated equipment to connect and disconnect the BUT to/from the test/peripheral devices. However, such automated equipment may entail significant capital expenditure.

DETAILED DESCRIPTION

Figure 1:
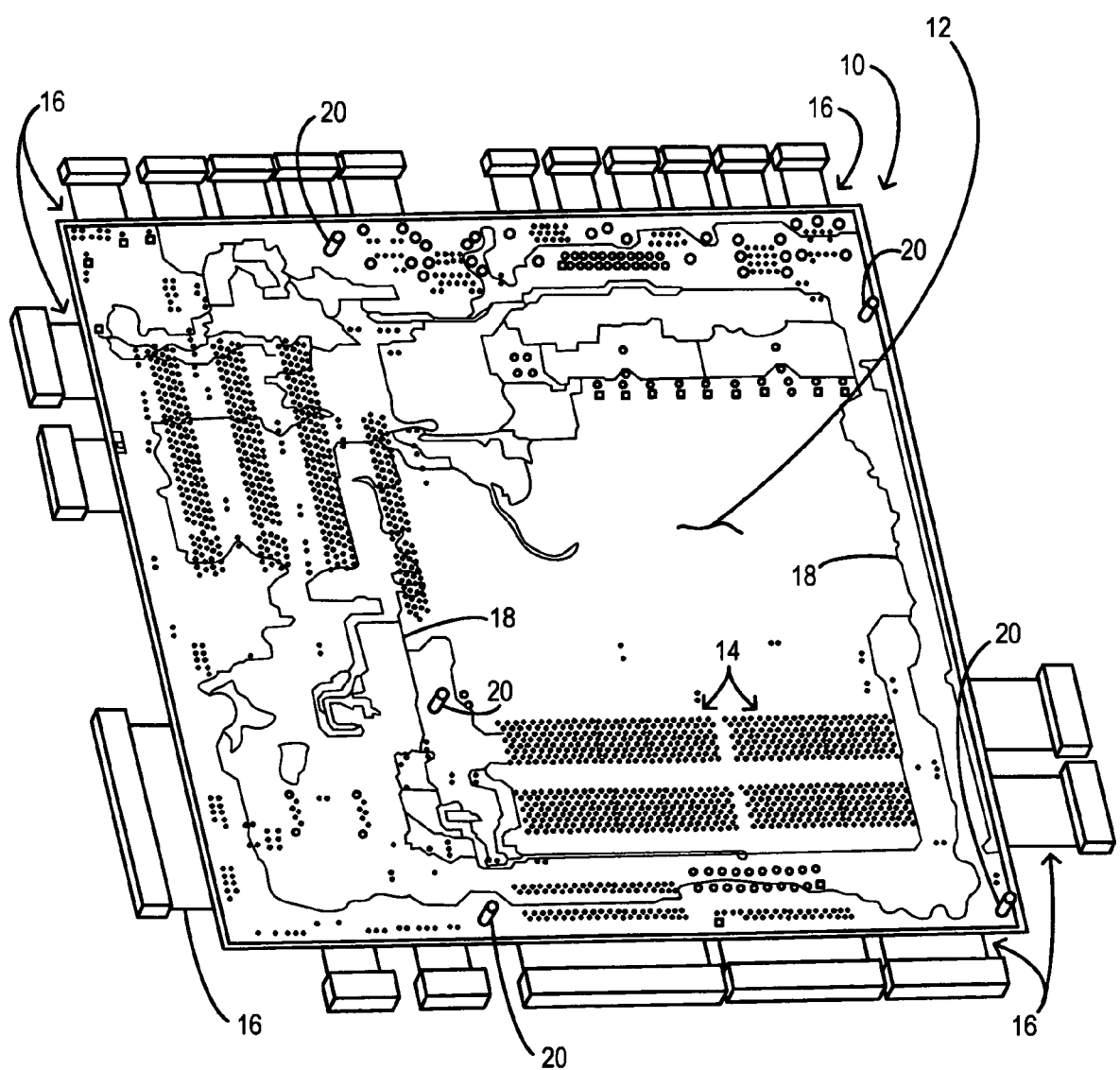
FIG. 1 is a schematic isometric view of a test interface sheet provided according to some embodiments.

FIG. 1 is a schematic isometric view of a test interface sheet 10 provided according to some embodiments. The test interface sheet 10 may include a flexible planar body 12, upon which a BUT (not shown in FIG. 1) may be placed. In some embodiments, the body 12 may be formed of a sheet of Mylar® or of any other material that may be suitable for construction of flexible electronic circuits. (As is well-known, the material sold under the trademark Mylar is a biaxially oriented thermoplastic film made from ethylene glycol and dimethyl terephthalate (DMT).) The body 12 may, in some embodiments, have a thickness in the range of 10-15 thousandths of an inch, or in the range of 25-30 thousandths of an inch.

The test interface sheet 10 may also have a considerable number of electrically conductive contact pads formed on the upper surface of the body 12. Some of the pads are indicated at 14 in FIG. 1. The pads may be formed on the body 12 in a pattern that matches a pattern of pins on the underside of the BUT (not shown in FIG. 1) with which the test interface sheet is to be used. The pads may be formed of solder, copper or another suitable conductive substance.

The test interface sheet 10 also may have a considerable number of electrical (e.g., data signal) connectors 16 which are mechanically coupled to the periphery of the body 12 and are arranged around the periphery of the body 12. The test interface sheet 10 further includes a considerable number of traces (of which some are indicated at 18, and of which many are not shown to simplify the drawing) which electrically couple ones of the pads to the connectors 16. The traces may be formed, for example, on the top surface and/or on the bottom surface of the body 12. The traces may be formed of copper or another suitable electrically conductive material. It will be appreciated that the body 12 itself may be of an insulative material such as the above-mentioned Mylar.

In some embodiments, the test interface sheet 10 may also include guide pins 20 that are affixed to the body 12 and which extend upwardly from the body 12 in a pattern that corresponds to a pattern of holes in the BUT. The guide pins may be shaped and sized to allow the guide pins to be inserted into the holes in the BUT. The guide pins may, in some embodiments, be formed of metal or plastic, and may be secured to the body 12 by riveting, screwing or other suitable technique. In some embodiments the guide pins may have threading or grooves to allow fasteners to be attached to the guide pins after the BUT is in place on the sheet 10.

Figure 2:
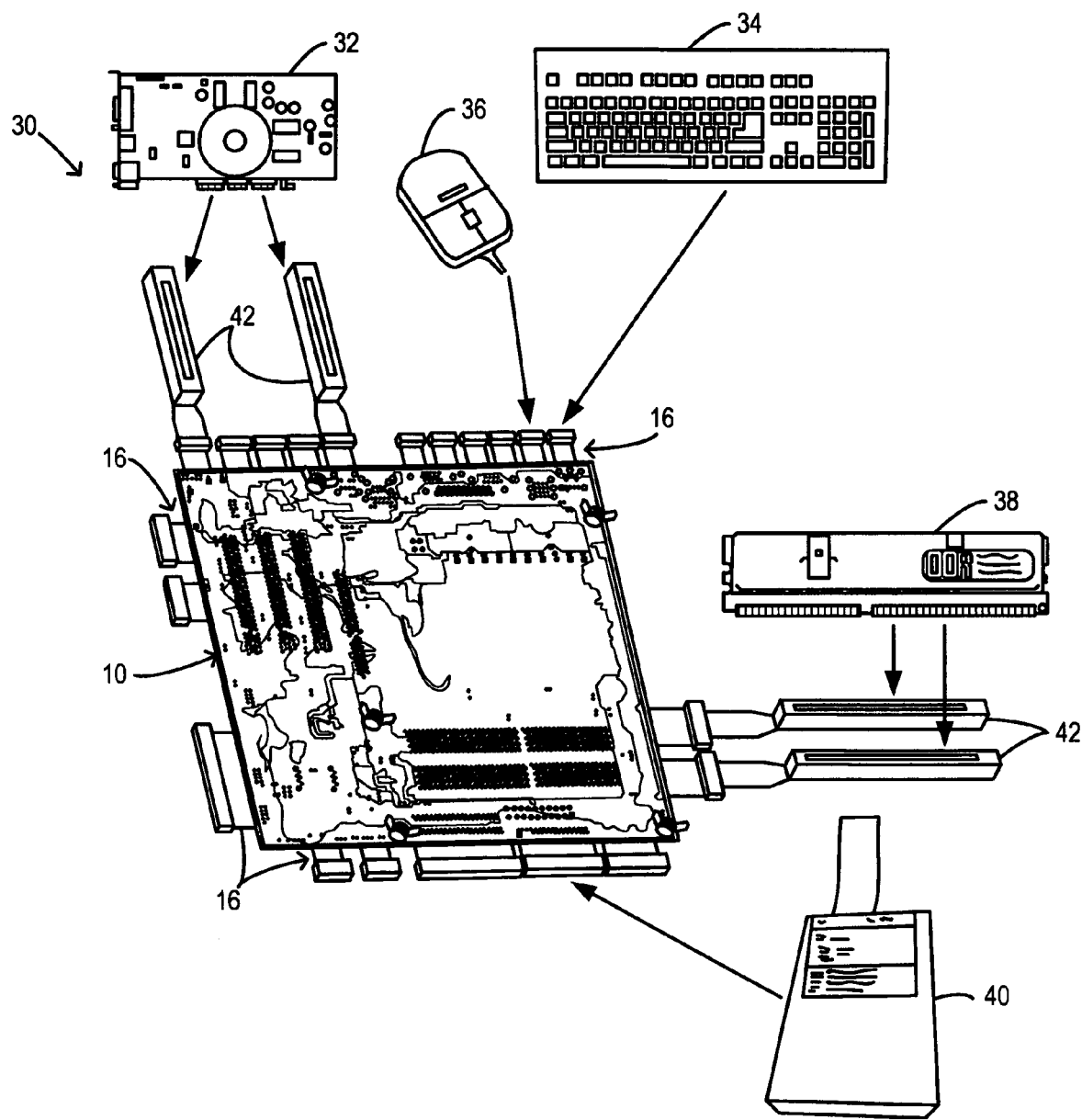
FIG. 2 is a schematic block diagram showing a portion of a circuit board test set-up which includes the test interface sheet of FIG. 1.

FIG. 2 is a schematic block diagram showing a portion of a circuit board test set-up 30 which includes the test interface sheet 10. The test set-up 30 also includes a number of peripheral devices, such as a video card 32, a keyboard 34, a mouse 36, a memory card 38 and a disk drive 40 (floppy or hard). Where required, an interface board 42 may be provided to allow peripheral devices (e.g., card devices) to connect to ones of the connectors 16 of the test interface sheet 10. Otherwise, peripheral devices may be plugged directly into connectors 16. In accordance with some embodiments, the peripheral devices may remain coupled to the test interface sheet 10 via connectors 16 while a sequence of BUTs are placed on the test interface sheet 10, tested, and then removed from the test interface sheet. The peripheral devices may operate, in effect, as "test signal generating devices", a term which, as used herein and in the appended claims, includes conventional personal computer components or any other device that may be coupled to a BUT to apply test signals to the BUT.

Figure 3:
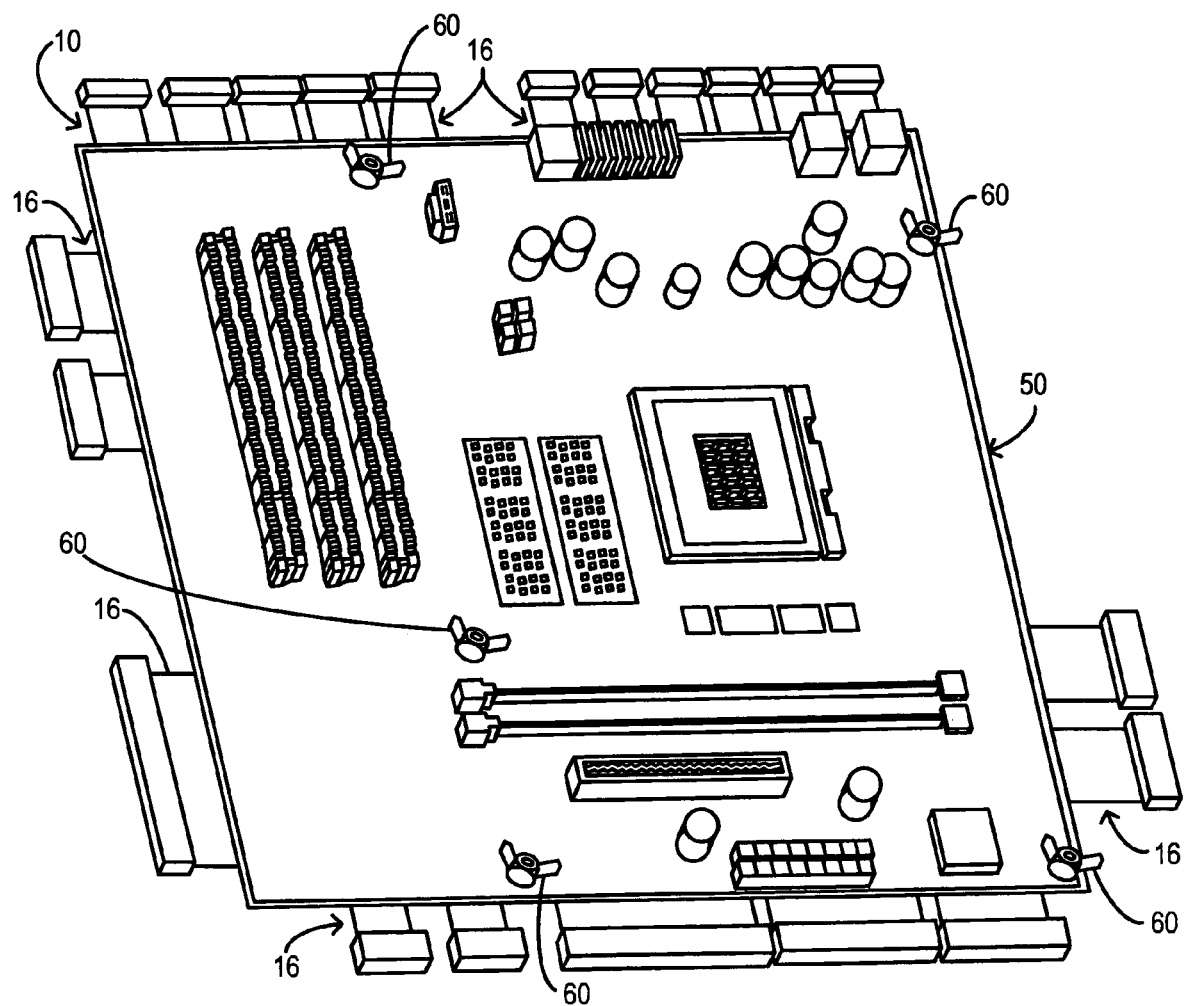
FIG. 3 is a schematic isometric view of a circuit board under test placed for testing on the test interface sheet of FIG. 1.

FIG. 3 is a schematic isometric view of a BUT 50 placed for testing on the test interface sheet 10. (The view of FIG. 3 is taken from above, and in the illustrated embodiment, the body of the test interface sheet 10 is substantially the same in horizontal extent as the BUT 50, so that only connectors 16 of the test interface sheet are visible in FIG. 3.) In some embodiments the BUT 50 may be a conventional motherboard for a personal computer, or any other type of circuit board. It will be understood that the nature and number of test signal generating devices (not shown in FIG. 3) coupled to the test interface sheet (and coupled for test purposes to the BUT via the test interface sheet) may vary, depending on the nature of the BUT.

Figure 4:
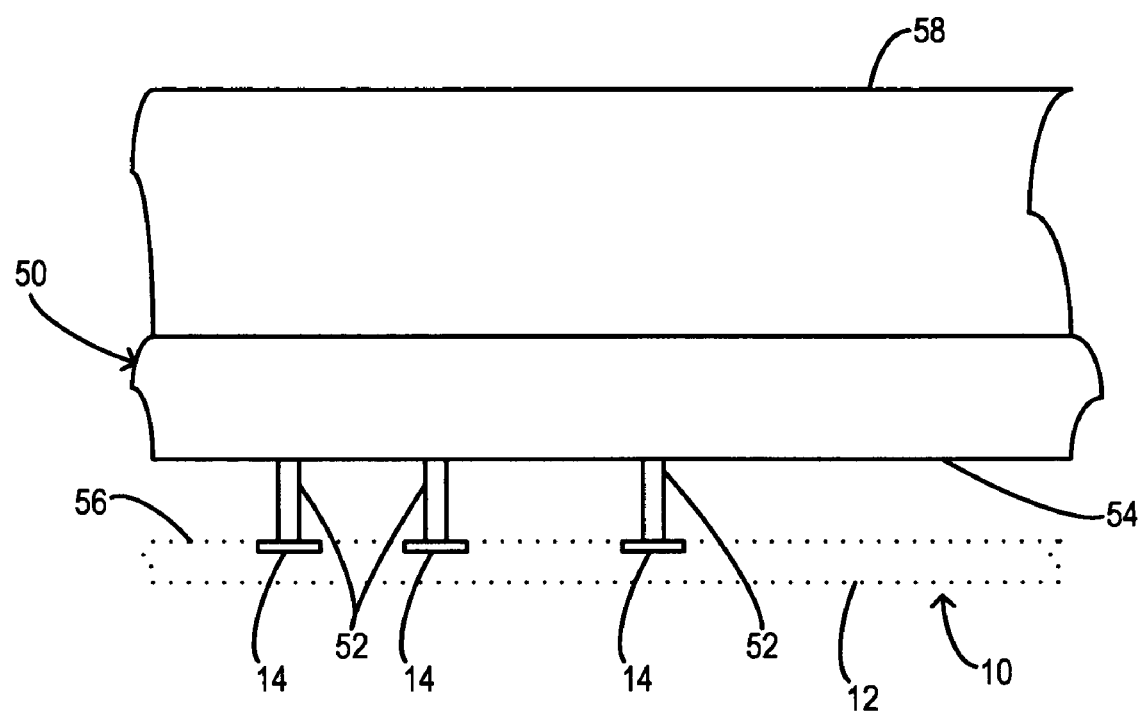
FIG. 4 is a partial side schematic view showing certain details of the BUT in conjunction with the test interface sheet.

As more concretely illustrated in FIG. 4, the BUT 50 is placed on the test interface sheet so that conductive pins 52 on the underside 54 of the BUT are in electrically conductive contact with the pads 14 on the top surface 56 of the body 12 (shown in phantom in FIG. 4) of the test interface sheet 10. At least some of the pins 52 may be constituted by terminals of devices (e.g., a packaged integrated circuit 58, partially shown in FIG. 4) that are mounted with a through-hole mount (THM) technique on the BUT. Moreover, as used herein and in the appended claims, the term "pin" includes a device terminal which extends through a through-hole of a circuit board. The term "pin" may further include test pins or other pins mounted on the underside of the BUT which are not device terminals.

With the BUT placed on the test interface sheet as indicated in FIG. 3, one or more of the peripheral devices (test signal generating devices) may be employed to apply test signals to the BUT via the test interface sheet. That is, test signals may be conducted from the test signal generating devices via the connectors 16 (FIGS. 1 and 3), traces 18 (FIG. 1) and pads 14 of the test interface sheet to the pins on the underside of the BUT to allow testing of the BUT to occur. It will be appreciated that with the interface provided by the test interface sheet, it is not necessary for individual ones of the test signal generating devices to be plugged into the BUT.

Figure 5:
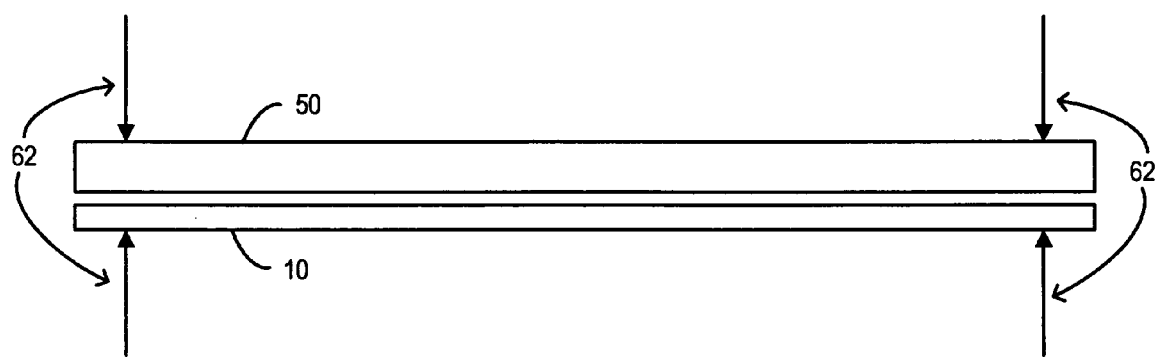
FIG. 5 is a schematic side view that illustrates a technique for securing the BUT to the test interface sheet according to some embodiments.

To assure reliable contact between the pins on the underside of the BUT and the pads on the top surface of the body of the test interface sheet, the BUT may be screwed down onto the test interface sheet by, e.g., wingnuts 60 (FIG. 3) threaddedly engaged with the guide pins 20 (best seen in FIG. 1) of the test interface sheet 10, with the guide pins inserted into holes in the BUT. Alternatively, the BUT 50 and the test interface sheet 10 may be clamped together with clamps (schematically represented by pairs of arrows 62 in FIG. 5) positioned at edges of the BUT and the test interface sheet. Although only two clamps are indicated in FIG. 5, the number of clamps actually employed may be greater. Although not explicitly shown in FIG. 5, the test interface sheet 10 may, as before, include guide pins or the like to interact with holes and/or edges of the BUT 50 to aid in assuring proper registration between the pins on the BUT and the conductive contact pads on the test interface sheet.

Figure 6:
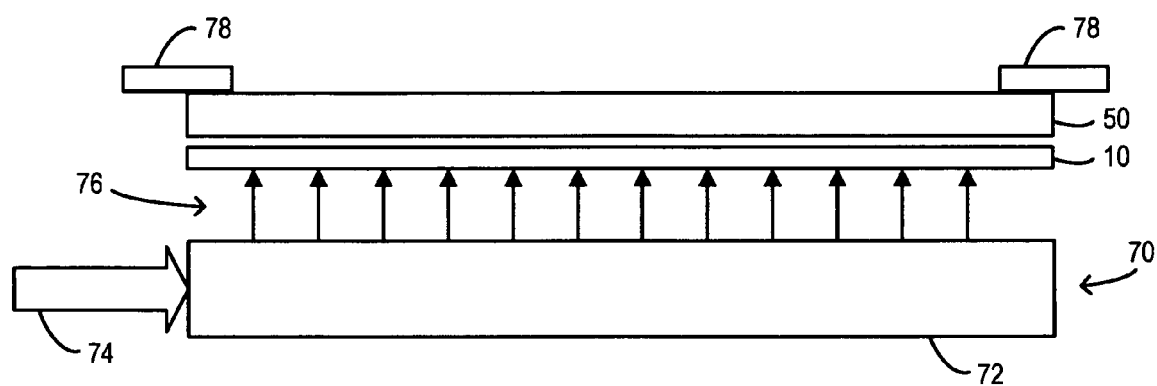
FIG. 6 is a view similar to FIG. 5, but illustrating a technique for securing the BUT to the test interface sheet according to other embodiments.

In other embodiments, a mechanism may be provided to bias the test interface sheet upwardly against the underside of the BUT. One embodiment of this kind is schematically illustrated in FIG. 6. As seen from FIG. 6, a bias device 70 includes an inflatable member 72 positioned below the test interface sheet 10. As indicated schematically by arrow 74, air or another gas may be applied to the inflatable member 72 to inflate the inflatable member so that the inflatable member applies an upward biasing force (represented by arrows 76) to the lower surface of the test interface sheet 10. The bias device 70 may operate to apply the upward biasing force to the test interface sheet 10 across substantially all of the lower surface of the test interface sheet to aid in assuring positive contact between all of the contact pads (not shown in FIG. 6) of the test interface sheet and the respective pins (not shown in FIG. 6) of the BUT 50. One or more stops 78 may be provided to limit the upward movement of the BUT 50 and to hold the BUT 50 in place against the upward biasing force applied to the test interface sheet by the bias device 70. Although not explicitly shown in FIG. 6, the test interface sheet 10 may, as in previously described embodiments, include guide pins or the like to interact with holes and/or edges of the BUT 50 to aid in assuring proper registration between the pins on the BUT and the conductive contact pads on the test interface sheet.

In still other alternative embodiments, the bias device 70 may, in place of the inflatable member 72, include a bed of springs that extends below the test interface sheet like a mattress (and, as in a mattress, the bias device may include a cover surface interposed between the springs and the test interface sheet). In these embodiments, a downward force may be applied to the BUT to sandwich the test interface sheet between the BUT and the upward biasing force applied to the test interface sheet by the bias device.

Although not shown in FIGS. 5 and 6, it should be understood that the test set-ups illustrated in those drawings also include peripheral devices, test signal generating devices or the like which are coupled to the test interface sheets as described in connection with FIG. 2, for example.

According to other embodiments, instead of guide pins on the test interface sheet, a rigid plate with guide pins may be provided below the test interface sheet, and holes or edges of either or both of the test interface sheet and the BUT may be employed to guide the test interface sheet and the BUT into place on the rigid plate.

In some embodiments, holes by which the BUT is guided into place may be mounting holes to be used to mount the BUT in a computer or server. In some embodiments, the BUT may include guide pins instead of or in addition to holes to aid in properly positioning the BUT with respect to the test interface sheet.

Embodiments illustrated herein suggest that the test interface sheet has substantially the same horizontal dimensions as the BUT. Such need not be the case, as the test interface sheet may be larger or smaller in horizontal extent than the BUT. If the test interface sheet is larger than the BUT, the additional area on the test interface sheet may facilitate routing of traces between the conductive contact pads and the connectors of the test interface sheet.

In some embodiments, the pad and trace layouts for the test interface sheet may be at least partially generated by an automated process, which may rely at least in part on data files and/or drawings that represent the trace and device layout of the BUT.

The body of the test interface sheet need not be flexible, and in some embodiments may be formed of the same type of rigid material customarily used to fabricate a circuit board.

Test methods and apparatus as described herein may substantially reduce the amount of manual operations required for testing each circuit board, since the operator need only properly secure the BUT to the test interface sheet (to which the test signal generating devices remain connected) instead of individually and laboriously plugging the test signal generating devices into the BUT. Similarly, removing the BUT from the test set-up is also streamlined, since the test signal generating devices need not be individually unplugged from the BUT at the end of the test procedure. Thus labor costs for testing may be reduced and test throughput increased without the capital expenditure required for automatic plugging/unplugging equipment.

A further increase in throughput and reduction in cost may be realized since the test methods and apparatus described herein may prevent errors and false indications of board defects that may otherwise result from improper plugging of the test signal generating devices into the BUT in conventional test procedures. Another possible benefit of removing the need for manual plugging and unplugging of the test signal generating devices may be reduction or elimination of damage to the BUT that may result from manual plugging and unplugging.

An additional reduction in cost may be realized by eliminating the need for custom interposers and spring-pin probing systems that may be required in conventional manual and automated board test procedures. Further, wear and tear on consumable items such as cables, cards, etc., may be substantially reduced by eliminating plugging and unplugging, so that there is a reduction in expense for such consumable items.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method comprising:
   placing a circuit board on a test sheet so that conductive pins on an underside of the circuit board are in electrically conductive contact with electrically conductive contact pads on an upper surface of the test sheet, the test sheet including connectors at a periphery of the test sheet which couple the test sheet to test signal generating devices; and
   applying test signals to the circuit board via the test sheet;
   wherein said applying includes coupling each of a plurality of peripheral devices to the circuit board via the test sheet and using each of said peripheral devices to apply test signals to the circuit board, said plurality of peripheral devices including at least three of: (a) a video card, (b) a keyboard, (c) a mouse, (d) a memory card and (e) a disk drive, said coupling of each of the peripheral devices to the circuit board being such that signals are allowed to be conducted from each of the peripheral devices to the circuit board.

2. The method of claim 1, further comprising:
   upwardly biasing the test sheet against the circuit board.

3. The method of claim 2, wherein the upwardly biasing includes inflating an inflatable member under the test sheet.

4. The method of claim 3, wherein the test sheet is formed of a flexible material.

5. The method of claim 1, wherein the test sheet is formed of a flexible material.

6. The method of claim 5, wherein the test sheet is formed of Mylar.

7. The method of claim 1, further comprising inserting guide pins on the test sheet into holes in the circuit board.

8. The method of claim 1, further comprising clamping the circuit board to the test sheet.

9. An apparatus comprising:
   a sheet having electrically conductive pads on an upper surface thereof;
   a circuit board secured on the sheet; and
   a plurality of peripheral devices each electrically coupled to the circuit board via the sheet such that signals are allowed to be conducted from each of the peripheral devices to the circuit board;
   wherein said plurality of peripheral devices includes at least three of: (a) a video card, (b) a keyboard, (c) a mouse, (d) a memory card and (e) a disk drive.

10. The apparatus of claim 9, further comprising a bias device to upwardly bias the sheet against the circuit board.

11. The apparatus of claim 10, wherein the bias device includes an inflatable member.

12. The apparatus of claim 9, wherein the sheet is formed of a flexible material.

13. The apparatus of claim 12, wherein the sheet is formed of Mylar.

14. The apparatus of claim 9, wherein the sheet has guide pins, each of said guide pins extending upwardly through a respective hole in the circuit board.

15. The apparatus of claim 9, wherein each of the conductive pads of the sheet is in contact with a respective pin on the underside of the circuit board.

16. A test sheet to interface a circuit board to a plurality of test signal generating devices, the test sheet comprising:
   a generally rectangular planar body having a first side, a second side, a third side and a fourth side; a plurality of electrically conductive contact pads formed on an upper surface of the body in a pattern that matches a pattern of pins on an underside of the circuit board; and a plurality of connectors arranged around a periphery of the body and electrically coupled to ones of the contact pads, said connectors including first connectors extending in a first direction from said first side of said planar body, second connectors extending in a second direction from said second side of said planar body, second connectors extending in a second direction from said second side of said planar body, said second direction divergent 90° from said first direction ,third connectors extending in a third direction from said third side of said planar body, said third direction divergent 180° from said first direction, and a fourth connectors extending in a fourth direction from said fourth side of said planar body, said fourth direction divergent 180° from said second direction.

17. The test sheet of claim 16, wherein the body is flexible.

18. The test sheet of claim 17, wherein the body is formed of Mylar.

19. The test sheet of claim 16, wherein the contact pads are formed of copper.

20. The test sheet of claim 16, further comprising a plurality of guide pins extending upwardly from the upper surface of the body.

21. The test sheet of claim 20, wherein grooves or threads are formed in the guide pins.

* * * * *